US012111477B1

(12) United States Patent
Robinson

(10) Patent No.: US 12,111,477 B1
(45) Date of Patent: Oct. 8, 2024

(54) MOUNTING SYSTEM FOR HEAD-MOUNTED DEVICES

(71) Applicant: Vuzix Corporation, West Henrietta, NY (US)

(72) Inventor: Aidan Michael Robinson, East Rochester, NY (US)

(73) Assignee: Vuzix Corporation, West Henrietta, NY (US)

( * ) Notice: Subject to any disclaimer, the term of this patent is extended or adjusted under 35 U.S.C. 154(b) by 0 days.

(21) Appl. No.: 18/186,360

(22) Filed: Mar. 20, 2023

(51) Int. Cl.
*G02B 27/01* (2006.01)
*H05K 5/02* (2006.01)

(52) U.S. Cl.
CPC ....... *G02B 27/0176* (2013.01); *H05K 5/0213* (2013.01); *G02B 2027/0154* (2013.01); *G02B 2027/0161* (2013.01); *G02B 2027/0169* (2013.01)

(58) Field of Classification Search
CPC .... G02B 2027/0154; G02B 2027/0161; G02B 2027/0169; H05K 5/0213
See application file for complete search history.

(56) References Cited

U.S. PATENT DOCUMENTS

| | | | | |
|---|---|---|---|---|
| 6,034,653 | A * | 3/2000 | Robertson | G02B 27/0176 348/794 |
| 6,680,802 | B1 | 1/2004 | Ichikawa et al. | |
| 8,038,292 | B2 | 10/2011 | Matsumoto et al. | |
| 8,040,292 | B2 * | 10/2011 | Ronzani | G02B 27/017 345/87 |
| 8,446,676 | B2 | 5/2013 | Sugihara et al. | |
| 9,329,391 | B2 * | 5/2016 | Park | G02B 27/0176 |
| 11,195,678 | B1 * | 12/2021 | Prendergast | H01H 36/0033 |
| 2010/0245585 | A1 * | 9/2010 | Fisher | H04N 7/18 348/240.99 |
| 2014/0146282 | A1 * | 5/2014 | Lu | G02C 5/045 351/118 |
| 2014/0339385 | A1 * | 11/2014 | Boer | B60R 11/0235 248/222.52 |

(Continued)

FOREIGN PATENT DOCUMENTS

| | | |
|---|---|---|
| JP | 2004078057 | 3/2004 |
| WO | 2017120353 A1 | 7/2017 |
| WO | 2021022092 A1 | 2/2021 |

*Primary Examiner* — William Boddie
*Assistant Examiner* — Bipin Gyawali
(74) *Attorney, Agent, or Firm* — Harter Secrest & Emery LLP; Michael Nicholas Vranjes

(57) ABSTRACT

A mounting system for head-mounted devices, including an electronic component housing and an adapter plate. The electronic component housing may be a display module or a battery, and includes a first surface and a plurality of holes. The adapter plate may be connected to a head mount and is arranged to slidingly connect to the electronic component housing, such that the electronic component housing is adjustable with respect to the adapter plate in a slidingly displaceable manner. The adapter plate includes a second surface, at least one tab or channel arranged to slidingly engage the electronic component housing, and at least one resilient tabular member arranged to engage the first surface. The at least one resilient tabular member is arranged to engage the first surface to resist or prevent sliding displacement of the electronic component housing with respect to the adapter plate.

5 Claims, 13 Drawing Sheets

(56) References Cited

U.S. PATENT DOCUMENTS

2017/0168305 A1* 6/2017 Kusuda .............. G02B 27/0176
2019/0346682 A1* 11/2019 Kang ................. G02B 27/0176
2020/0278555 A1* 9/2020 Porter ............... G02B 27/0176
2020/0379257 A1* 12/2020 Lee ................... G02B 27/0172

* cited by examiner

MOUNTING SYSTEM FOR HEAD-MOUNTED DEVICES

TECHNICAL FIELD

The present disclosure generally relates to devices for securing electronic devices to a user's head, and more particularly, to an adapter plate for securing electronic devices to a user's head.

BACKGROUND

Head-Mounted Displays (HMDs), which can take the form of a suspended monocular eyepiece, can include an image source and, in some examples, an image light guide for presenting virtual images to a wearer's eyes. The image light guide can be arranged for conveying the virtual images from an offset position of the image source to a position aligned with the wearer's eye. For many applications, there is particular value in forming a virtual image that can be visually superimposed over the real-world image that lies in the field of view of the HMD user.

HMDs require a mounting device for mounting the display and various other electronics, for example a battery, to the user's head. However, conventional systems for mounting HMDs fail to suitably secure the electronics to the user's head for extended periods of use. For example, conventional interference fit mounting devices exhibit material relaxation which results in failure.

SUMMARY

The present disclosure is directed to one or more exemplary embodiments of a mounting system for head-mounted devices, including an electronic component housing and an adapter plate. The electronic component housing may be, for example, a display module or a battery or battery housing, and includes a first surface and a plurality of holes. The adapter plate may be connected to a head mount and is arranged to slidingly connect to the electronic component housing, such that the electronic component housing is adjustable with respect to the adapter plate in a slidingly displaceable manner. The adapter plate includes a second surface, at least one tab or channel arranged to slidingly engage the electronic component housing, and at least one resilient tabular member extending from the second surface and arranged to engage the first surface. The at least one resilient tabular member is arranged to engage the first surface to prevent sliding displacement of the electronic component housing with respect to the adapter plate.

The present disclosure is directed to one or more exemplary embodiments of an adjustable display assembly.

In an exemplary embodiment, the adjustable display assembly, may comprise an electronic component housing, including a first surface, and a plurality of holes, and an adapter plate, including a second surface, at least one channel arranged to slidingly engage at least a portion of the electronic component housing, and at least one resilient tabular member extending arranged to engage the first surface. In an exemplary embodiment, the electronic component housing is a display module housing and the plurality of holes are vent holes.

In an exemplary embodiment, the at least one resilient tabular member comprises a third surface arranged to at least partially engage the first surface, and a protrusion extending from the third surface, the protrusion arranged to at least partially engage a respective hole of the plurality of holes to resist sliding displacement of the electronic component housing with respect to the adapter plate. In an exemplary embodiment, the protrusion comprises at least one ramp surface arranged at an acute angle with respect to the third surface. In an exemplary embodiment, the protrusion comprises a first ramp surface extending from the third surface, the first ramp surface arranged at a first angle with respect to the third surface, and a second ramp surface extending from the third surface, the second ramp surface arranged at a second angle with respect to the third surface, the second angle being different than the first angle. In an exemplary embodiment, the second angle is greater than the first angle. In an exemplary embodiment, the at least one resilient member further comprises a leg extending from the adapter plate, wherein at least a portion of the leg forms the third surface. In an exemplary embodiment, the leg is curvilinear.

In an exemplary embodiment, the first surface is curvilinear and the second surface is curvilinear, the second surface corresponding to the first surface. In an exemplary embodiment, one of the first surface and the second surface is convex and the other of the first surface and the second surface is concave. In an exemplary embodiment, the at least one resilient tabular member comprises a first resilient tabular member, and a second resilient tabular member, the second resilient tabular member spaced apart from the first resilient tabular member. In an exemplary embodiment, the at least one resilient tabular member applies a force to the electronic component housing to resist sliding displacement of the electronic component housing with respect to the adapter plate.

In an exemplary embodiment, the at least one channel comprises a first channel and a second channel, the adapter plate further comprises a first tab forming the first channel between the second surface and the first tab, and the adapter plate further comprises a second tab forming the second channel between the second surface and the second tab. In an exemplary embodiment, the first tab and the second tab are operatively arranged to slidingly engage a first groove and a second groove in the electronic component housing. In an exemplary embodiment, the adjustable display assembly further comprises a head mount, wherein the adapter plate is pivotably connected to the head mount.

The present disclosure is directed to one or more exemplary embodiments of an adjustable display assembly.

In an exemplary embodiment, the adjustable display assembly may comprise a display module, including a first surface, a plurality of vent holes, a first groove, and a second groove, and an adapter plate, including a section including a second surface, a first tab spaced apart from the section and forming a first channel, the first tab operatively arranged to slidingly engage the first groove, a second tab spaced apart from the section and forming a second channel, the second tab operatively arranged to slidingly engage the second groove, and at least one resilient tabular member extending from the section and arranged to at least partially engage the first surface to resist displacement of the display module with respect to the adapter plate.

In an exemplary embodiment, the at least one resilient tabular member comprises a third surface arranged to engage the first surface, and a protrusion extending from the third surface, the protrusion arranged to at least partially engage a respective vent hole of the plurality of vent holes to resist sliding displacement of the electronic component housing with respect to the adapter plate. In an exemplary embodiment, the protrusion comprises at least one ramp surface arranged at an acute angle with respect to the third surface. In an exemplary embodiment, the at least one resilient tabular member comprises a first resilient tabular member, and a second resilient tabular member, the second resilient tabular member spaced apart from the first resilient tabular member.

The present disclosure is directed to one or more exemplary embodiments of an adapter plate for a head-mounted adjustable display assembly.

In an exemplary embodiment, the adapter plate for the head-mounted adjustable display assembly may comprise a section including a surface, a first tab arranged on a first end of the section, the first tab spaced apart from the surface and forming a first channel, a second tab arranged on a second end of the section, opposite the first end, the second tab spaced apart from the surface and forming a second channel, a first resilient tabular member extending radially from the section between the first tab and the second tab, and a second resilient tabular member extending radially from the section between the first tab, the second resilient tabular member being spaced apart from the first resilient tabular member, wherein at least one of the first resilient tabular member and the second resilient tabular member comprises an engaging surface and a protrusion extending from the engaging surface.

These and other aspects, objects, features, and advantages of the present disclosure will be more clearly understood and appreciated from the following detailed description of the embodiments and appended claims, and by reference to the accompanying drawing figures.

BRIEF DESCRIPTION OF THE DRAWING FIGURES

The accompanying drawings are incorporated herein as part of the specification. The drawings described herein illustrate embodiments of the presently disclosed subject matter and are illustrative of selected principles and teachings of the present disclosure. However, the drawings do not illustrate all possible implementations of the presently disclosed subject matter and are not intended to limit the scope of the present disclosure in any way.

DETAILED DESCRIPTION

Figure 1:
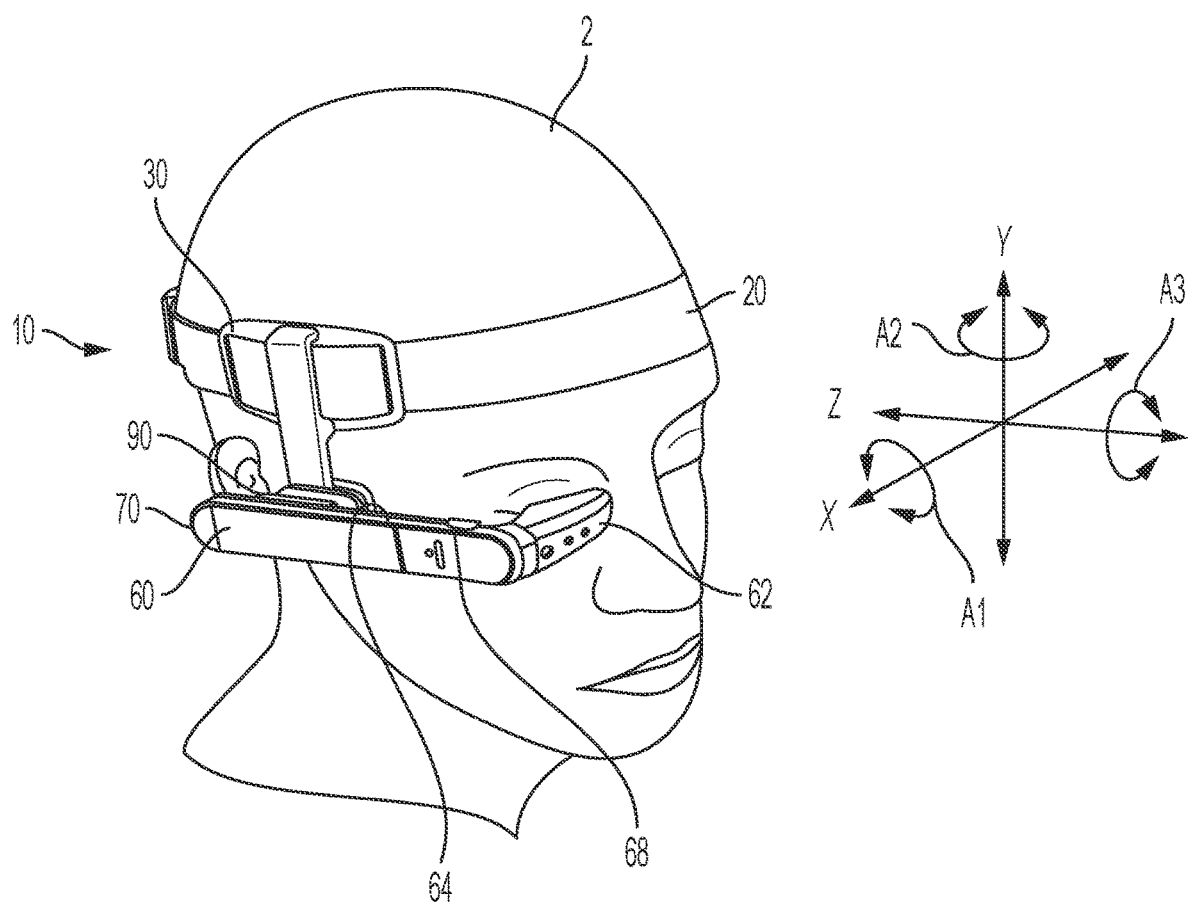
FIG. 1 is a top front perspective view of an adjustable display assembly being worn by a user.

It is to be understood that the invention may assume various alternative orientations and step sequences, except where expressly specified to the contrary. It is also to be understood that the specific assemblies and systems illustrated in the attached drawings and described in the following specification are simply exemplary embodiments of the inventive concepts defined herein. Hence, specific dimensions, directions, or other physical characteristics relating to the embodiments disclosed are not to be considered as limiting, unless expressly stated otherwise. Also, although they may not be, like elements in various embodiments described herein may be commonly referred to with like reference numerals within this section of the application.

Where used herein, the terms "first", "second," and so on, do not necessarily denote any ordinal, sequential, or priority relation, but are simply used to more clearly distinguish one element or set of elements from another, unless specified otherwise.

Where used herein, the terms "viewer," "operator." "observer." "wearer," and "user" are considered equivalents and refer to the person or machine who wears and/or views images using a head mounted device.

Where used herein, the term "set" refers to a non-empty set, as the concept of a collection of elements or members of a set is widely understood in elementary mathematics. The term "subset," unless otherwise explicitly stated, is used herein to refer to a non-empty proper subset, that is, to a subset of the larger set, having one or more members. For a set S, a subset may comprise the complete set S. A "proper subset" of set S, however, is strictly contained in set S and excludes at least one member of set S.

Where used herein, the term "about" when applied to a value is intended to mean within the tolerance range of the equipment used to produce the value, or, in some examples, is intended to mean plus or minus 10%, or plus or minus 5%, or plus or minus 1%, unless otherwise expressly specified.

Where used herein, the term "substantially" is intended to mean within the tolerance range of the equipment used to produce the value, or, in some examples, is intended to mean plus or minus 10%, or plus or minus 5%, or plus or minus 1%, unless otherwise expressly specified.

Where used herein, the term "exemplary" is intended to mean "an example of," "serving as an example," or "illustrative," and does not denote any preference or requirement with respect to a disclosed aspect or embodiment.

One skilled in the relevant art will recognize that the elements and techniques described herein can be practiced without one or more of the specific details, or with other methods, components, materials, etc. In some instances, well-known structures, materials, or operations are not shown or described in detail to avoid obscuring certain aspects of the present disclosure. Reference throughout the specification to "one embodiment" or "an embodiment" means that a particular feature, structure, or characteristic described in connection with the embodiment is included in at least one embodiment of the present disclosure. Thus, the appearance of the phrase "in one embodiment" or "in an embodiment" throughout the specification is not necessarily referring to the same embodiment. However, the particular features, structures, or characteristics described may be combined in any suitable manner in one or more embodiments.

Adverting now to the figures, FIG. 1 is a top front perspective view of adjustable display assembly 10 being worn by user 2. In an exemplary embodiment, adjustable display assembly 10 comprises head mount 30, adapter plate 90, and an electronic device to be mounted to the head of user 2, for example, display module 60 or a battery (not shown). In an exemplary embodiment, adjustable display assembly 10 further comprises headband 20. Headband 20 is operatively arranged to adjustably secure head mount 30 to user 2.

Display module 60 is pivotably connected to head mount 30 via adapter plate 90, as will be described in greater detail below. Display module 60 generally comprises a processor (not shown) arranged within housing 64 and display 62. Display 62 is generally arranged in front of an eye of user 2 and produces one or more images and conveys the one or more images to the eye of user 2. Display module 60 is operatively arranged to be adjusted by pivoting about head mount 30. As shown, display module 60 is capable of being rotated or pivoted relative to the X-axis, as indicated by arrow A1, the Y-axis, as indicated by arrow A2, and/or the Z-axis as indicated by arrow A3. Display module 60 is also operatively arranged to be translatable with respect to head mount 30 generally along the X-axis, Y-axis and/or Z-axis. Specifically, display module 60 is slidably engaged with adapter plate 90, as will be described in greater detail below.

Figure 2A:
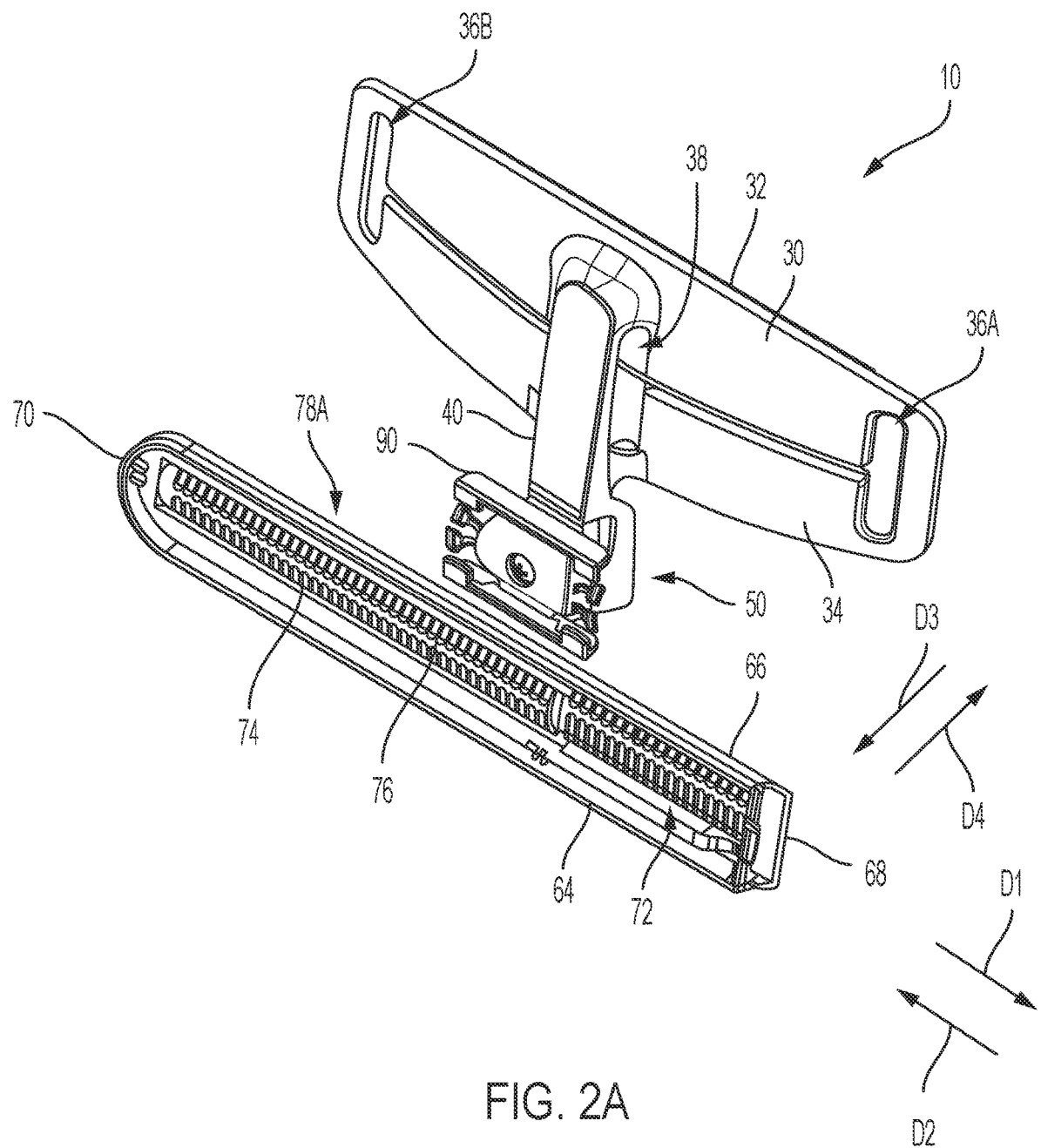
FIG. 2A is a top front partial exploded perspective view of the adjustable display assembly shown in FIG. 1.
Figure 2B:
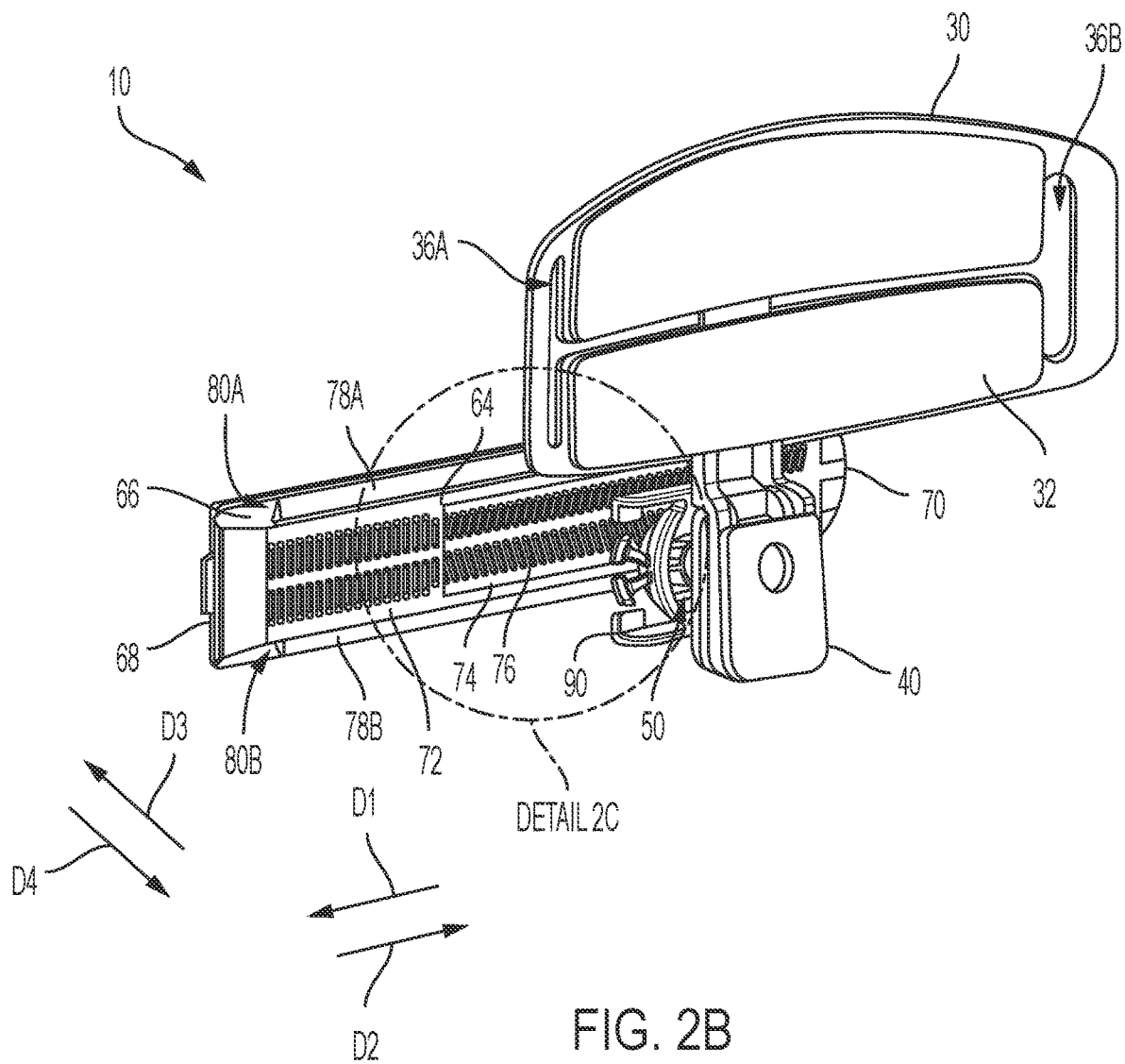
FIG. 2B is a top rear partial exploded perspective view of the adjustable display assembly shown in FIG. 1.
Figure 2C:
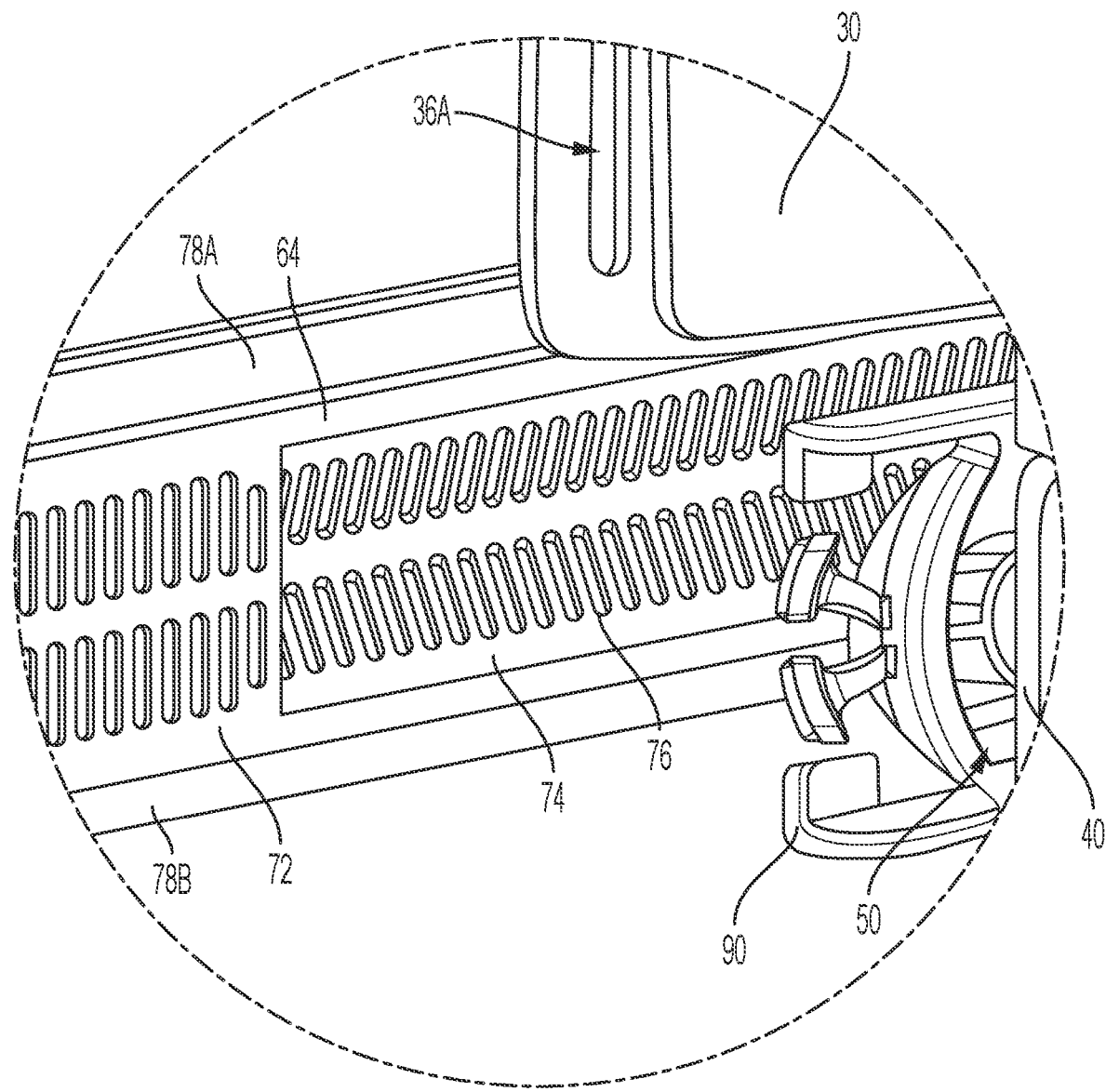
FIG. 2C is a detail view taken generally along DETAIL 2C in FIG. 2B.

FIG. 2A is a top front partial exploded perspective view of adjustable display assembly 10. FIG. 2B is a top rear partial exploded perspective view of adjustable display assembly 10. FIG. 2C is a detail view taken generally along DETAIL 2C in FIG. 2B.

As shown in FIGS. 2A-2B, head mount 30 comprises inner surface 32, outer surface 34, and extension 40. Inner surface 32 is arranged to engage user 2 (as shown in FIG. 1). Head mount 30 further comprises hole 36A and hole 36B operatively arranged to engage headband 20 (as shown in FIG. 1). In an exemplary embodiment, headband 20 extends through hole 36A from inner surface 32 to outer surface 34, along outer surface 34, and then through hole 36B from outer surface 34 to inner surface 32. In an exemplary embodiment, head mount 30 further comprises hole 38, through which headband 20 extends. The arrangement of holes 36A-36B and 38 maintain alignment of headband 20 and proper securement of head mount 30 to user 2.

With continued reference to FIGS. 2A-2B, display module housing 64 comprises outer surface 66, front end 68, and rear end 70. Outer surface 66 comprises a plurality of holes 76. In an exemplary embodiment, holes 76 are through-holes extending completely through display module housing 64, namely, outer surface 66. In such exemplary embodiment, such through-holes are embodied as vent holes. Vent holes 76 are operatively arranged to allow air flow in and out of housing 64, for example, to remove heat from the processor and/or other electronic components arranged therein. In an exemplary embodiment, holes 76 extend only partially through display module housing 64, namely, outer surface 66. In such exemplary embodiment, holes 76 may be embodied as depressions, channels, or indentations in outer surface 66. In an exemplary embodiment, holes 76 are longitudinally arranged along housing 64, for example, arranged in a linear array substantially from proximate front end 68 to proximate rear end 70. In an exemplary embodiment, surface 66 comprises planar section or surface 72 and curvilinear section or surface 74. In one example, curvilinear section 74 is concave and corresponds to a convex curvilinear surface 94 of adapter plate 90, as will be described in greater detail below. In other exemplary embodiments curvilinear section 74 is convex and corresponds to a concave curvilinear surface 94 of adapter plate 90. Holes 76 are arranged in curvilinear section 74. In an exemplary embodiment, holes 76 are arranged in curvilinear section 74 and planar section 72. In an exemplary embodiment, holes 76 are arranged as slots, namely, long narrow apertures or slits in housing 64. Housing 64 further comprises rails 78A-78B operatively arranged to engage channels 98A-98B, respectively, to slidingly engage display module 60 with head mount 30, as will be described in greater detail below. In an exemplary embodiment, and as best shown in FIG. 2B, rails 78A-78B are generally elongate protrusions that extend from surface 66, thereby creating channels or grooves 80A-80B. Grooves 80A-80B are thus formed between rails 78A-78B and surface 66, respectively, and are operatively arranged to engage tabs 100A-100B of adapter plate 90, as will be described in greater detail below.

Figure 3:
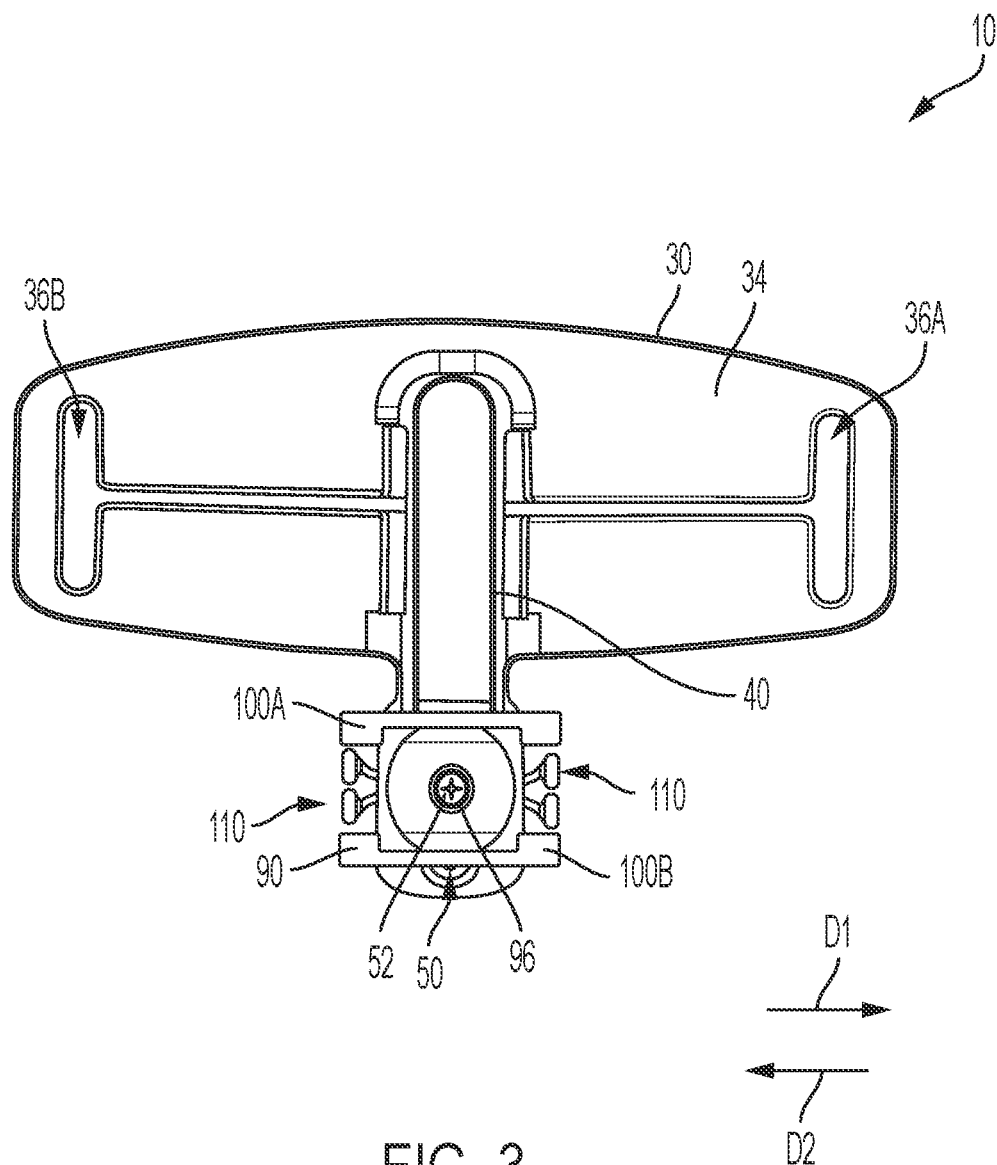
FIG. 3 is a front elevational view of the adjustable display assembly shown in FIG. 1.
Figure 4A:
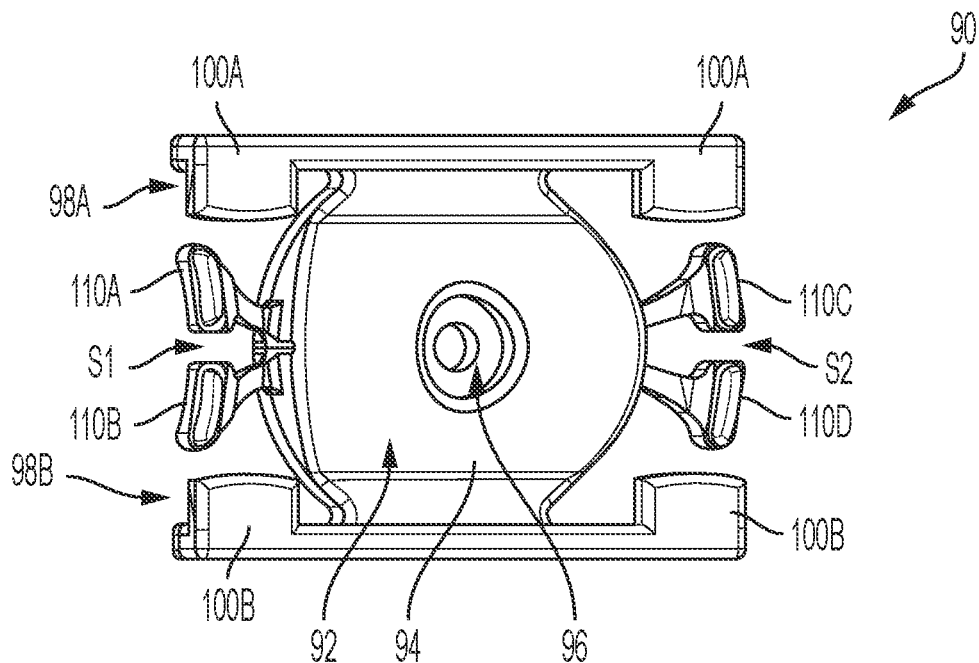
FIG. 4A is a front perspective view of the adapter plate shown in FIG. 1.
Figure 4B:
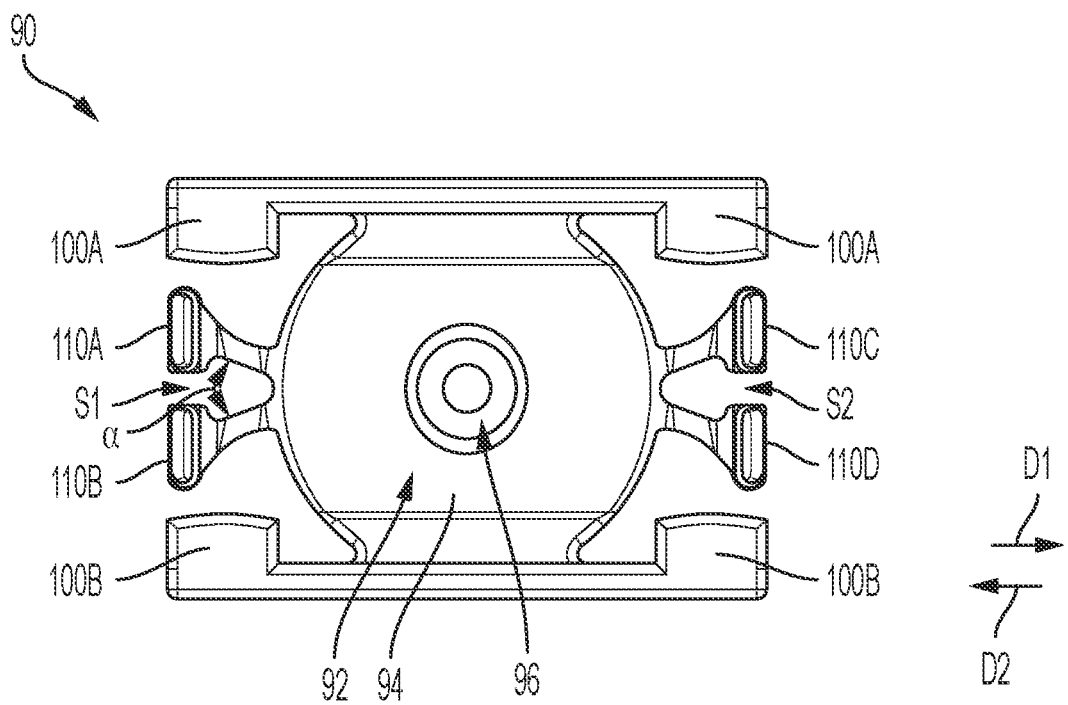
FIG. 4B is a front elevational view of the adapter plate shown in FIG. 1.
Figure 4C:
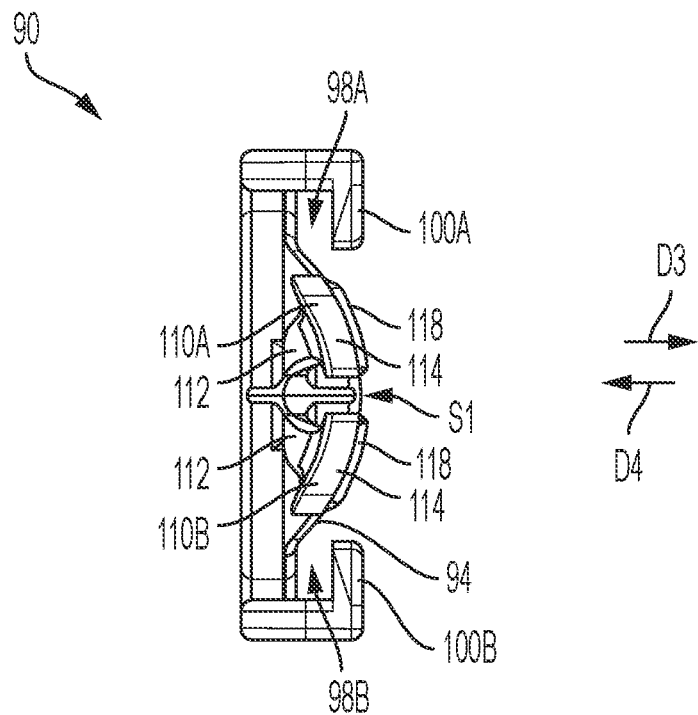
FIG. 4C is a side elevational view of the adapter plate shown in FIG. 1.

FIG. 3 is a front elevational view of adjustable display assembly 10. FIG. 4A is a front perspective view of adapter plate 90. FIG. 4B is a front elevational view of adapter plate 90. FIG. 4C is a side elevational view of adapter plate 90.

Adapter plate 90 comprises section 92, a plurality of channels, for example, channel 98A-98B, and one or more resilient tabular members 110, for example, resilient tabular members 110A-110D. Adapter plate 90 is connected to head mount 30 by, for example, extension 40, via a pivotable connection such as ball joint 50. Thus, one of adapter plate 90 and head mount 30 comprises a ball and the other of adapter plate 90 and head mount 30 comprises a socket. Adapter plate 90 may be secured to ball joint 50 (e.g., the ball) via connector or fastener 52. An example of such connection is shown in International Patent Application Publication No. WO 2017/120353 (Porter et al.), which application is incorporated by reference herein in its entirety. In an exemplary embodiment, section 92 comprises through-bore 96, which may be used to connect adapter plate 90 to head mount 30, for example, via fastener 52. In an exemplary embodiment, through-bore 96 comprises a counter-bore and/or a countersink, and is centered vertically and horizontally within section 92.

Section 92 comprises surface 94 and is operatively arranged to engage or slidingly engage with housing 64. Specifically, surface 94 is operatively arranged to engage surface 74 of housing 64. In an exemplary embodiment, surface 94 is a convex curvilinear surface corresponding to the curvilinear shape of surface 74. Channel 98A is arranged on a first, top side of section 92 and is the space formed between one or more tabs, for example tabs 100A, and surface 94. Channel 98B is arranged on a second, bottom side of section 92, opposite the first, top side, and is the space formed between one or more tabs, for example tabs 100B, and surface 94. Tabs 100A-100B are operatively arranged to engage rails 78A-78B (as shown in FIG. 2B), respectively, such that housing 64 is slidingly connected to adapter plate 90 along at least first direction D1 and/or second direction D2. Specifically, surface 66 of housing 64 engages surface 94 and tabs 100A-100B wrap around rails 78A-78B to maintain such engagement by preventing displacement of housing 64 in direction D3 with respect to adapter plate 90. As shown in FIGS. 2A-2B, housing 64 is displaceable with respect to adapter plate 90 in direction D1 and direction D2. In an exemplary embodiment, the engagement of channels 98A-98B with rails 78A-78B is an interference fit, and housing 64 is slidable with respect to adapter plate 90 only if a predetermined amount of force, e.g., force along directions D1 or D2, is applied thereto (i.e., to overcome the interference fit). In an exemplary embodiment, tabs 98A-98B engage a respective longitudinal groove in rails 78A-78B. In an exemplary embodiment, tabs 98A-98B enclose rails 78A-78B, respectively.

Resilient tabular members 110A-110D (also referred to in the collective as "resilient tabular members 110" or in the singular as "resilient tabular member 110") are resilient members capable of elastic deformation, or being able to recoil or spring back into shape after bending, stretching, or being compressed. Resilient tabular members 110 extend from section 92. For example, resilient tabular members 110A-110B extend from section 92 generally in direction D2 and resilient tabular members 110C-100D extend from section 92 in direction D1. In some exemplary embodiments, as shown in FIG. 4C, resilient tabular members 110 extend from section 92 radially, i.e., in first direction D1 and/or second direction D2, and are arranged to extend from section 92 in direction D3 such that at least a portion of each leg 112 and/or foot 114 (both described below) extend past a plane defined by surface 94 of section 92 along third direction D3. In an exemplary embodiment, resilient tabular members 110 are circumferentially spaced. For example, resilient tabular members 110A-110B are circumferentially separated by space S1 and resilient tabular members 110C-110D are circumferentially separated by space S2. As such, it can be said that resilient tabular members 110A-110D extend radially from section 92. In an exemplary embodiment, resilient tabular members 110 are arranged at angle α (as shown in FIG. 4B) with respect to each other. In an exemplary embodiment, angle α is greater than 0 degrees and less than 90 degrees, for example, 45 degrees.

Figure 5:
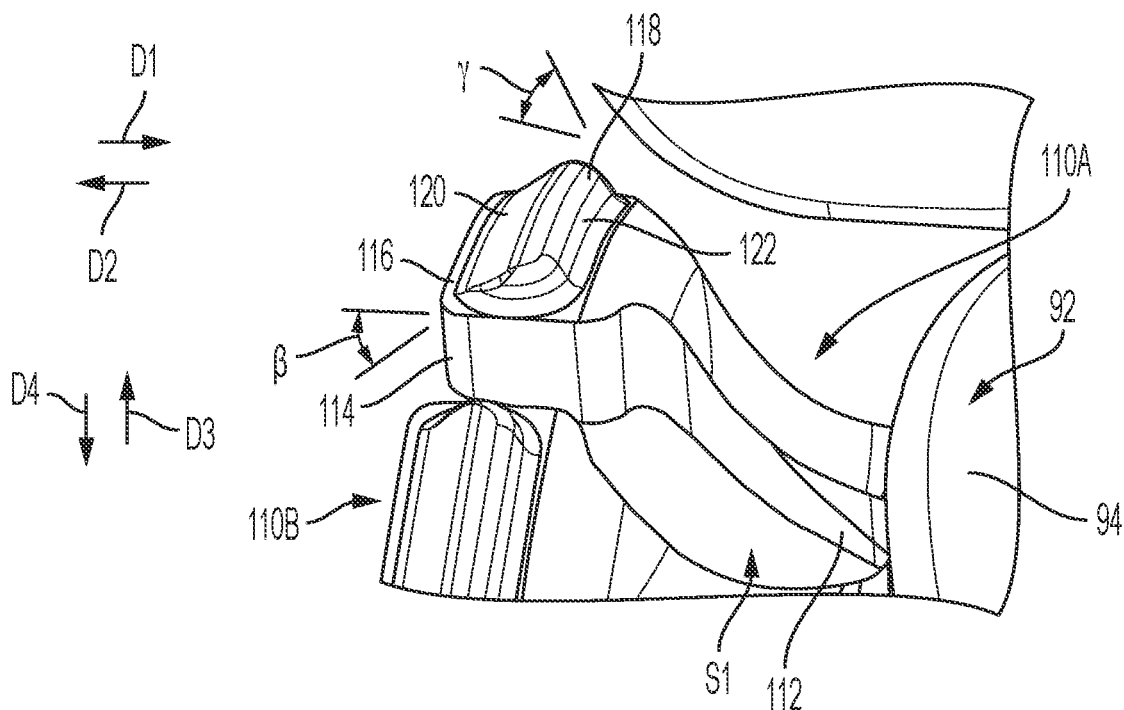
FIG. 5 is a detail view of the adapter plate shown in FIG. 1.

FIG. 5 is a detail view of a portion of adapter plate 90. Each resilient tabular member 110 comprises a leg 112 and a foot 114. Each leg 112 comprises a first end connected to section 92 and a second end connected to a respective foot 114. In an exemplary embodiment, and as shown, each leg 112 extends in direction D3 with respect to surface 94. In an exemplary embodiment, each leg 112 is curvilinear. Each foot 114 comprises a surface 116 and a protrusion 118. Each surface 116 is operatively arranged to engage surface 66, specifically curvilinear surface 74 of housing 64, when the respective protrusions sit within respective holes 76 of housing 64. In an exemplary embodiment, each surface 116 is curvilinear and corresponds to curvilinear surface 74. Each protrusion 118 extends in direction D3 with respect to each respective surface 116. Each protrusion 118 is operatively arranged to at least partially engage holes 76 to resist or prevent sliding or translational displacement of housing 64 with respect to adapter plate 90. By engage, it is mean that protrusions 118 extend at least partially through respective holes 76 in direction D3.

It should be appreciated that leg 112 is the resilient/deformable component of resilient tabular member 110. In an exemplary embodiment, legs 112 comprise nylon. In an exemplary embodiment, leg 112 comprises glass-filled nylon. The geometric shape of legs 112 combined with their chemical composition results in the optimal resilience and deformability of resilient tabular members 110. Specifically, resilient tabular members exhibit enough rigidity to maintain engagement of protrusions 118 with holes 76 and enough elasticity such that a user may easily adjust the electronics component with respect to adapter plate 90. In an exemplary embodiment, and as shown, legs 112 may be separated by spaces S1 and S2 and/or comprise a concave arrangement in direction D3 to facilitate more desirable resilience and deformability characteristics. In an exemplary embodiment, at least resilient tabular members 110 comprise glass-filled nylon. In an exemplary embodiment, adapter plate 90 comprises glass-filled nylon.

In an exemplary embodiment, each protrusion 118 comprises a respective surface or ramp surface 120 and a respective surface or ramp surface 122, which, along with surface 16, create a generally triangular cross-sectional area of protrusion 118. In an exemplary embodiment, each surface 120 is arranged at angle β with respect to surface 116. In an exemplary embodiment, angle β is an acute angle, for example, 40-50 degrees with respect to surface 116. In an exemplary embodiment, each surface 122 is arranged at angle γ with respect to surface 116. In an exemplary embodiment, angle γ is an acute angle, for example, 80 degrees. Angled ramp surfaces 120 and 122 facilitate engagement of one or more protrusions 118 with holes 76. It should be appreciated that each protrusion 118 may include a rounded section defined by the transition between angled ramp surfaces 120 and 122.

It should be appreciated that angle β and angle γ differ to allow for ease of adjustment. For example, ramp surface 120 comprises a less steep angle β with respect to surface 116, which reduces the amount of friction needed to disengage protrusion 118 from its respective vent hole 76 in a first direction, for example direction D2 as shown in FIG. 5. Ramp surface 122 comprises a steeper angle γ with respect to surface 116, which results in a higher amount of friction needed to disengage protrusion 118 from its respective vent hole 76 in a second direction, for example direction D1 as shown in FIG. 5, opposite the first direction. In an exemplary embodiment, this combination of a less steep surface 120 and a more steep surface 122 is mirrored across adapter plate 90 such that resilient tabular members 110A-110B require less force to disengage their respective protrusions 118 from holes 76 in direction D2 and more force to disengage their respective protrusions 118 from holes 76 in direction D1, and resilient tabular members 110C-110D require less force to disengage their respective protrusions 118 from holes 76 in direction D1 and more force to disengage their respective protrusions 118 from holes 76 in direction D2. Such arrangement allows user 2 to more effectively adjust electronics component 60 in directions D1-D2 relative to adapter plate 90 by reducing the overall force required to disengage protrusions 118 from their respective holes 76, as compared to protrusions having only steep ramp surfaces.

Referring generally to FIGS. 1-5, when assembling adjustable display assembly 10, adapter plate 90 is connected to head mount 30. As previously described, adapter plate 90 is connected to head mount 30 via ball joint 50, for example, using fastener 52. Housing 64 is then connected to adapter plate 90. Specifically, rails 78A-78B are aligned and engaged with channels 98A-98B such that section 92 substantially engages surface 66. Specifically, surface 94 engages surface 74, surfaces 116 engage surface 74, and protrusions 118 engage respective holes 76. Tabs 100A-100B resist and/or prevent disengagement of housing 64 from adapter plate 90. To adjust the position of display 62 relative to the eye of user 2, user 2 may apply a force to display housing 64, e.g., in direction D1 or direction D2. If and when the force exceeds a predetermined threshold, protrusions 118 are disengaged from holes 76 and housing 64 is displaced with respect to adapter plate 90, for example in direction D1 and direction D2 until protrusions 118 reengage with another set of holes 76 corresponding to a new relative position of the display with respect to the eye of the user 2.

Figure 6A:
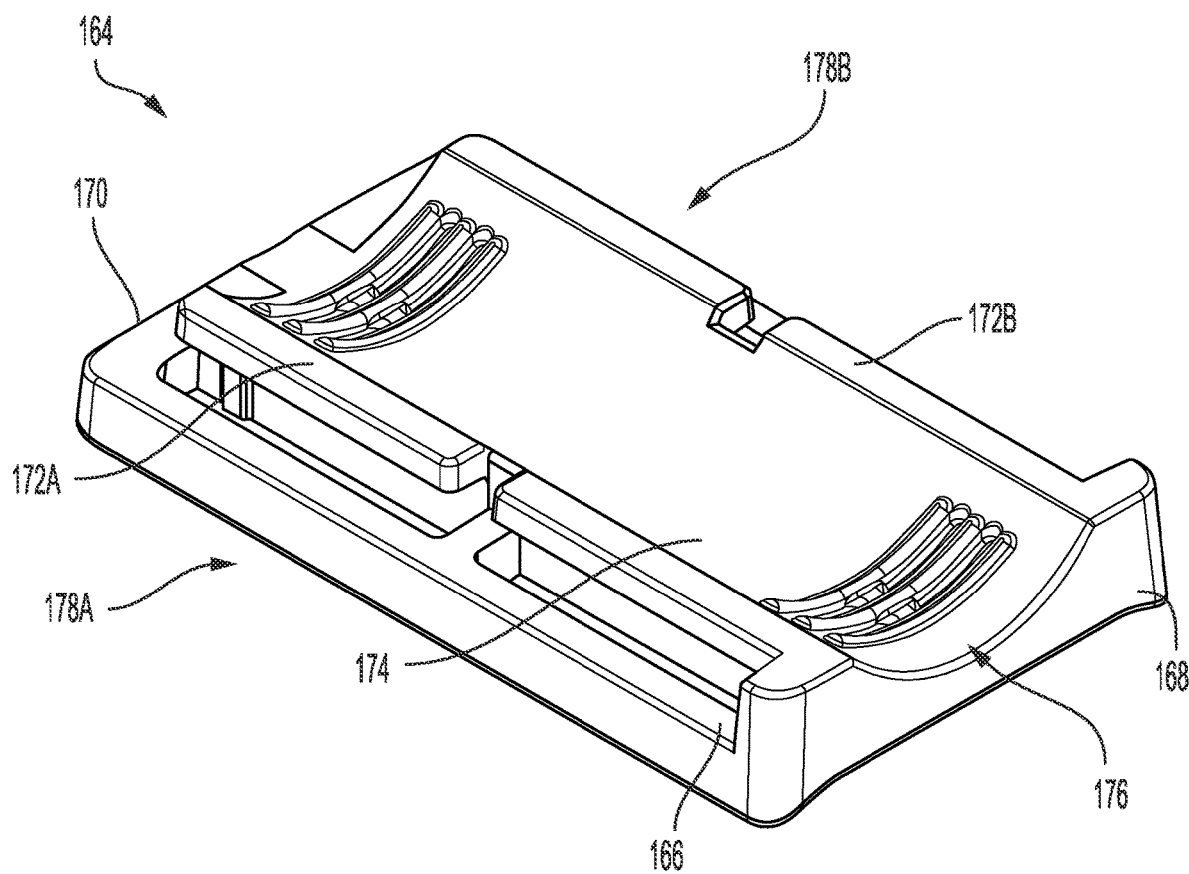
FIG. 6A is a front perspective view of a electronics component.
Figure 6B:
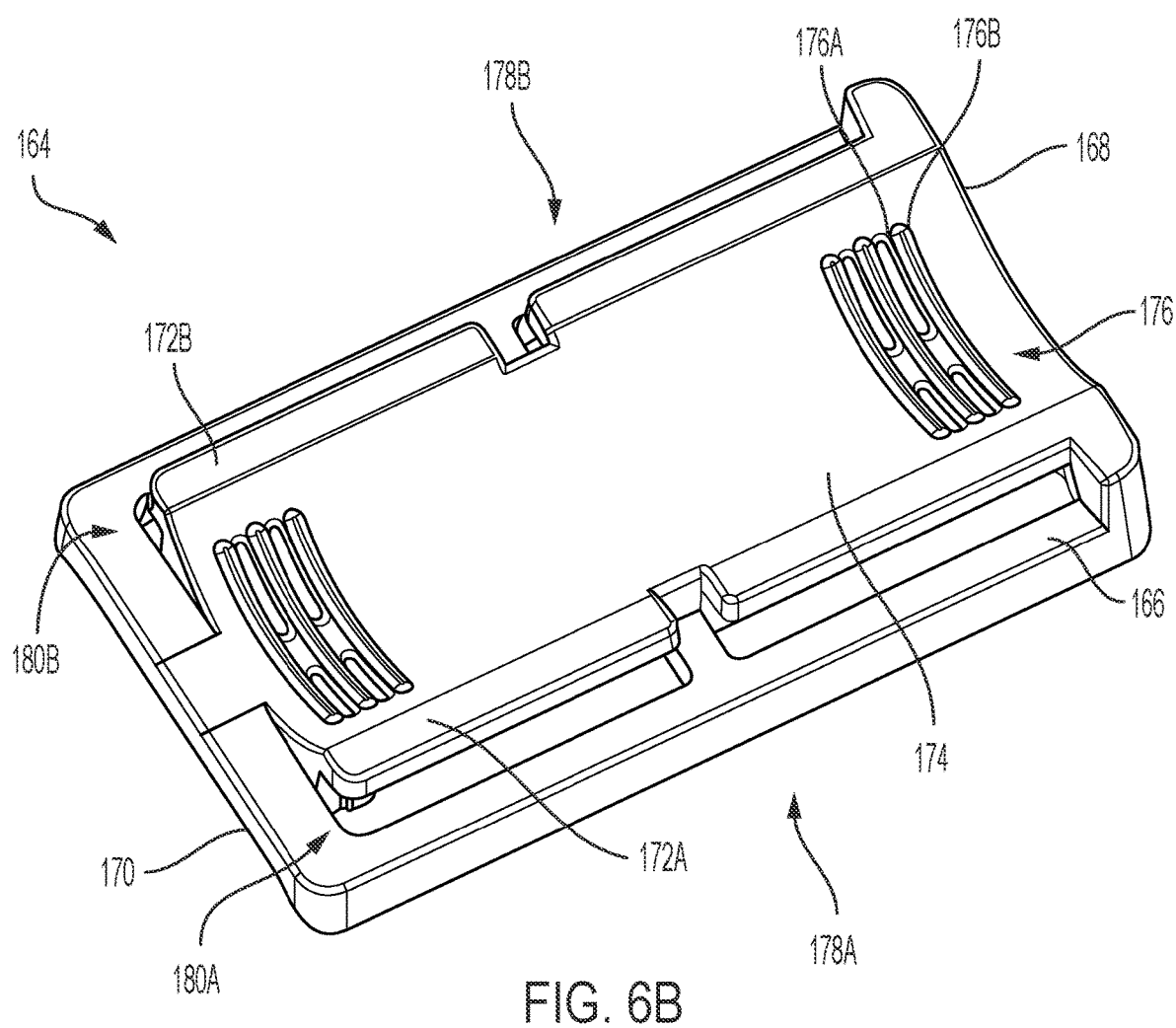
FIG. 6B is a front perspective view of the electronics component shown in FIG. 6A.
Figure 6C:
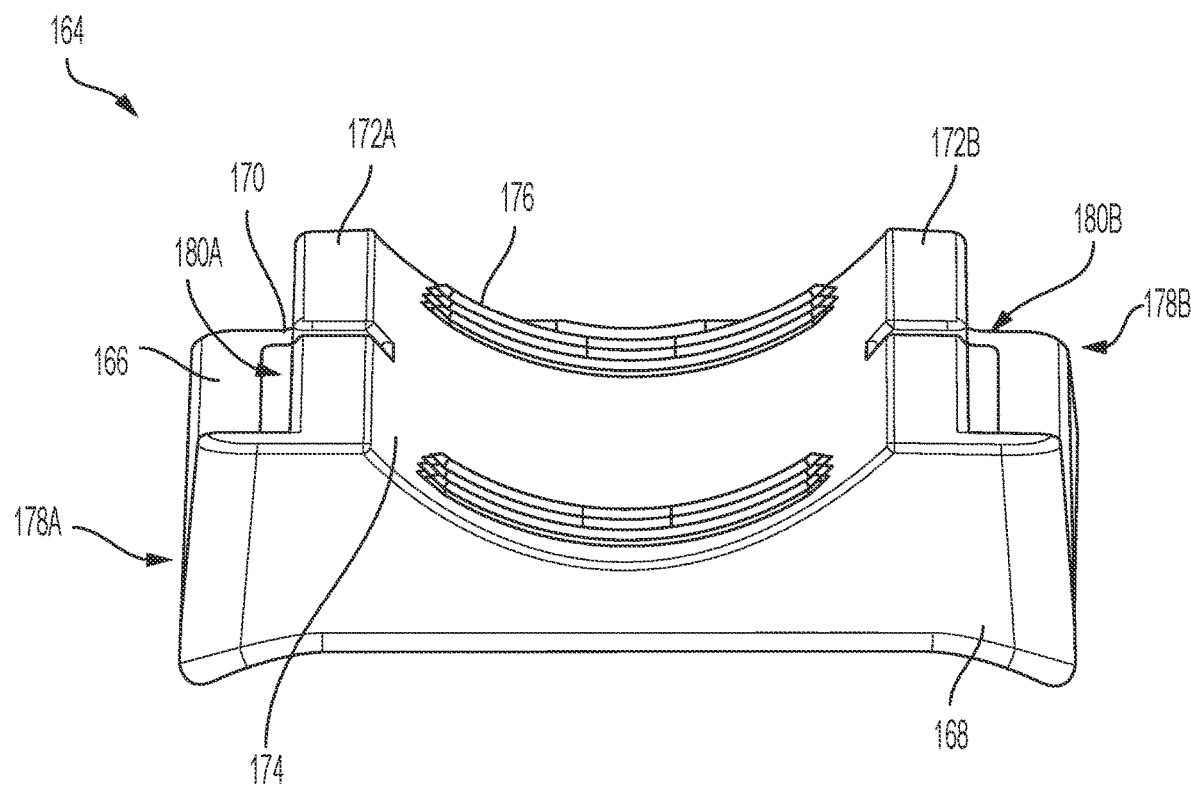
FIG. 6C is a front perspective view of the electronics component shown in FIG. 6A.
Figure 6D:
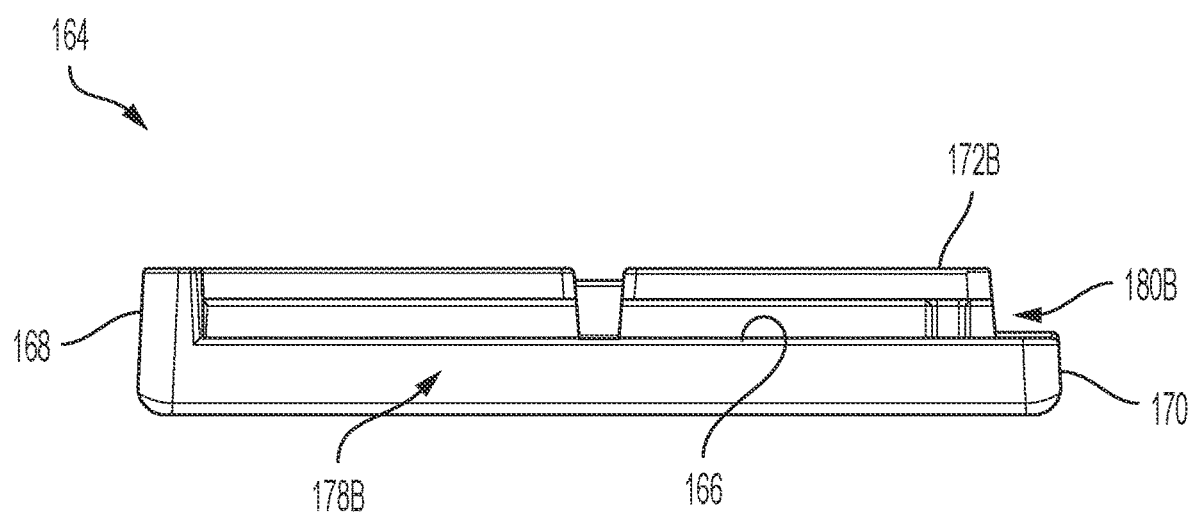
FIG. 6D is a bottom plan view of the electronics component shown in FIG. 6A.
Figure 6E:
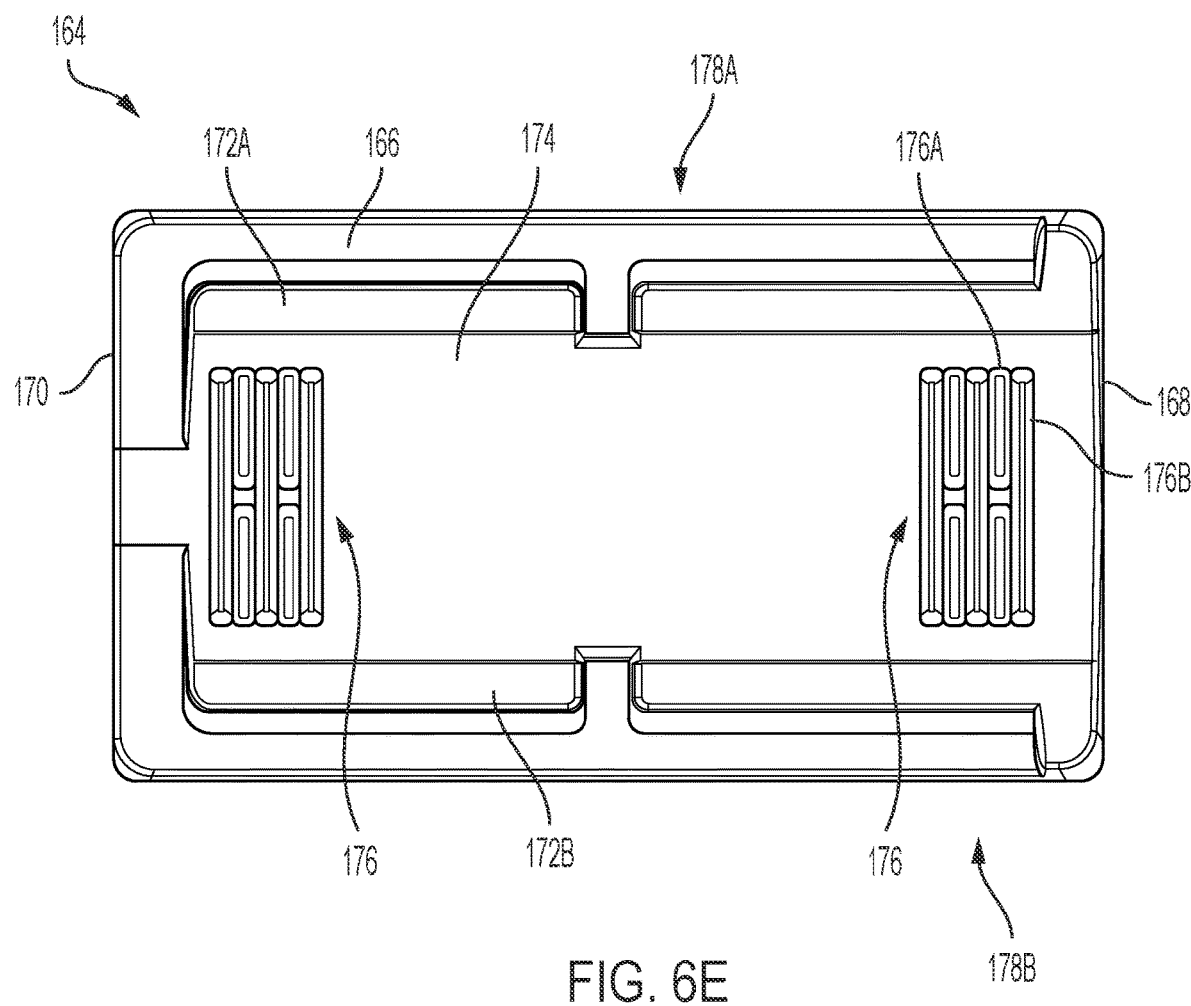
FIG. 6E is a side elevational view of the electronics component shown in FIG. 6A.
Figure 6F:
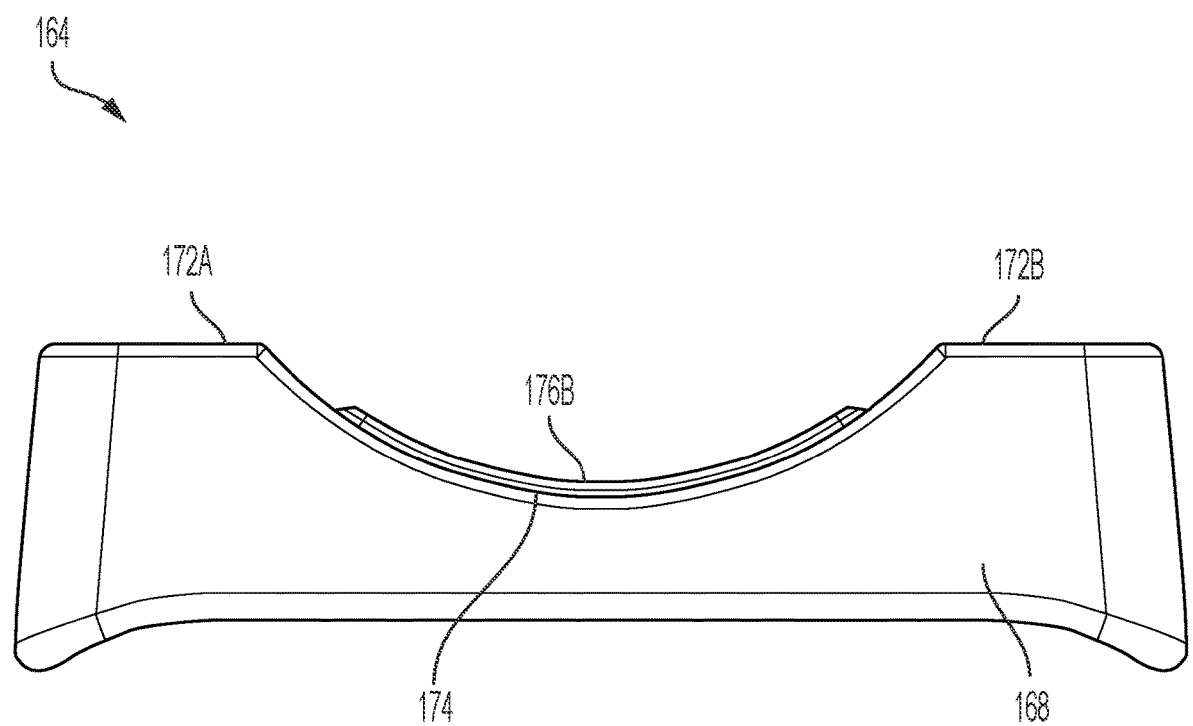
FIG. 6F is a front elevational view of the electronics component shown in FIG. 6A.

In an exemplary embodiment, other electronic devices may be pivotally connected to head mount 30 via adapter plate 90, for example, a battery. FIG. 6A is a front perspective view of electronic device or electronic device housing or electronics component 164. FIG. 6B is a front perspective view of electronics component 164. FIG. 6C is a front perspective view of electronics component 164. FIG. 6D is a bottom plan view of electronics component 164. FIG. 6E is a side elevational view of electronics component 164. FIG. 6F is a front elevational view of electronics component 164.

Electronics component 164 may be any part of an electronic device, for example, a battery housing or a battery. Electronics component 164 generally comprises surface 166, end 168, end 170, side 178A, side 178B, one or more tabs, for example tabs 172A-172B, curvilinear surface 174, and a plurality of engaging members 176. In one example embodiment, curvilinear section 174 is concave and corresponds to curvilinear surface 94 of adapter plate, as previously described with respect to display module housing 64. Tabs 172A-172B form substantially linear surfaces adjacent to curvilinear surface 174. Tabs 172A-172B are spaced apart from surface 166 and form channels 180A-180B therebetween. Channels 180A-180B are operatively arranged to engage channels 98A-98B of adapter plate 90 to secure electronics component 164 to adapter plate 90. Specifically, tabs 100A-100B engage tabs 172A-172B such that electronics component 164 is slidably engaged with adapter plate 90.

Engaging members 176 are operatively arranged on curvilinear surface 174 to engage with one or more protrusions 118 of adapter plate 90 to resist or prevent slidable displacement of electronics component 164 with respect to adapter plate. In an exemplary embodiment, engaging members 176 comprise a plurality of vent holes similar to that of housing 64. In an exemplary embodiment, and as shown, engaging members 176 comprises a plurality of grooves or holes 176A and/or a plurality of ridges 176B. In an exemplary embodiment, ridges 176B extend from surface 174. Grooves 176A are formed between ridges 176B. In an exemplary embodiment, holes 176A are arranged between ridges 176B. Holes 176A may be, for example, through-holes that operate as vents for electronic component 164.

When electronics component 164 is connected to adapter plate 90, surface 116 of foot 114 of adapter plate 90 is operatively arranged to engage curvilinear surface 174. One or more protrusions 118, which extend in direction D3 with respect to surface 116 as previously described, are operatively arranged to engage engaging members 176 to resist or prevent sliding or translational displacement of electronics component 164 with respect to adapter plate 90. By engage, it is meant that protrusions 118 extend at least partially into grooves and/or holes 176A, in between ridges 176B, in direction D3.

It should be appreciated that in an exemplary embodiment, ridges 176B are operatively arranged to reduce the adjustability of electronics component 164 with respect to adapter plate 90. For example, electronics component 164 may comprise a battery that does not require frequent adjustment and/or has a greater mass than other electronics components (e.g., a display module). In such embodiments, ridges 176B may be used to resist and/or prevent, at a higher degree, adjustment or displacement of electronics component 164 with respect to adapter plate 90 (i.e., ridges increase the amount of force required to disengage protrusions 118 from respective holes or grooves 176A). Moreover, the height of ridges 176B and/or the depth of holes or grooves 176A may be adjusted to increase or decrease the amount of force required to disengage protrusions 118 from respective holes or grooves 176A, for example, based on the weight of the electronics component to be engaged with adapter plate 90.

To assemble electronics component 164 with adapter plate 90, tabs 172A-172B are aligned and engaged with channels 98A-98B such that curvilinear surface 174 slidingly engages with surface 94. Surfaces 116 engage surface 174, and protrusions 118 engage respective engaging members 176. In an exemplary embodiment, protrusions 118 engage grooves 176A arranged between ridges 176B. In an exemplary embodiment, protrusions 118 engage ridges 176B. In an exemplary embodiment, protrusions 118 engage holes 176A arranged in surface 174. Tabs 100A-100B prevent disengagement of electronics component 164 from adapter plate 90 in any direction orthogonal to the sliding engagement between adapter plate 90 and electronics component 164. To adjust the position of electronics component 164 relative to user 2, user 2 may apply a force to electronics component 164, e.g., in direction D1 or D2. If and when the force exceeds a predetermined threshold, protrusions 118 are disengaged from engaging members 176 and electronics component 164 is displaced with respect to adapter plate 90, for example in direction D1 and direction D2.

One or more features of the embodiments described herein may be combined to create additional embodiments which are not depicted. While various embodiments have been described in detail above, it should be understood that they have been presented by way of example, and not limitation. It will be apparent to persons skilled in the relevant arts that the disclosed subject matter may be embodied in other specific forms, variations, and modifications without departing from the scope, spirit, or essential characteristics thereof. The embodiments described above are therefore to be considered in all respects as illustrative, and not restrictive. The scope of the invention is indicated by the appended claims, and all changes that come within the meaning and range of equivalents thereof are intended to be embraced therein.

What is claimed is:

1. An adjustable display assembly, comprising:
   a display module, including:
   a first surface;
   a plurality of vent holes;
   a first groove; and
   a second groove; and
   an adapter plate, including:
   a section including a second surface;
   a first tab spaced apart from the section and forming a first channel, the first tab operatively arranged to slidingly engage the first groove;
   a second tab spaced apart from the section and forming a second channel, the second tab operatively arranged to slidingly engage the second groove; and
   at least one resilient tabular member extending from the section and arranged to at least partially engage the first surface and the plurality of vent holes to resist displacement of the display module with respect to the adapter plate.

2. The adjustable display assembly as recited in claim 1, wherein the at least one resilient tabular member comprises:
   a third surface arranged to engage the first surface; and
   a protrusion extending from the third surface, the protrusion arranged to at least partially engage a respective vent hole of the plurality of vent holes to resist sliding displacement of the display module with respect to the adapter plate.

3. The adjustable display assembly as recited in claim 2, wherein the protrusion comprises at least one ramp surface arranged at an acute angle with respect to the third surface.

4. The adjustable display assembly as recited in claim 3, wherein the at least one resilient tabular member comprises:
- a first resilient tabular member; and
- a second resilient tabular member, the second resilient tabular member spaced apart from the first resilient tabular member.

5. An adapter plate for a head-mounted adjustable display assembly, comprising:
- a section including a surface;
- a first tab arranged on a first end of the section and extending radially inward therefrom, the first tab spaced apart from the surface and forming a first channel;
- a second tab arranged on a second end of the section, opposite the first end, the second tab spaced apart from the surface and forming a second channel, wherein the first tab and the second tab extend toward each other in opposite directions;
- a first resilient tabular member extending radially from the section between the first tab and the second tab; and
- a second resilient tabular member extending radially from the section between the first tab and the second tab, the second resilient tabular member being spaced apart from the first resilient tabular member,
- wherein at least one of the first resilient tabular member and the second resilient tabular member comprises an engaging surface and a protrusion extending from the engaging surface.

\* \* \* \* \*